United States Patent
Heipp et al.

(10) Patent No.: US 8,231,414 B2
(45) Date of Patent: Jul. 31, 2012

(54) SENSOR INTERCONNECT SYSTEM

(75) Inventors: Christ H. Heipp, Chagrin Falls, OH (US); Geoffrey G. Cochrane, Seville, OH (US)

(73) Assignee: GVI Technology Partners, Ltd., Twinsburg, OH (US)

(*) Notice: Subject to any disclaimer, the term of this patent is extended or adjusted under 35 U.S.C. 154(b) by 1975 days.

(21) Appl. No.: 11/243,309

(22) Filed: Oct. 4, 2005

(65) Prior Publication Data

US 2006/0081065 A1      Apr. 20, 2006

Related U.S. Application Data

(60) Provisional application No. 60/615,831, filed on Oct. 4, 2004.

(51) Int. Cl.
   *H01R 12/00* (2006.01)
(52) U.S. Cl. .......................... 439/700; 439/74
(58) Field of Classification Search .................. 439/700, 439/74, 66
   See application file for complete search history.

(56) References Cited

U.S. PATENT DOCUMENTS

| | | | |
|---|---|---|---|
| 4,151,416 A | 4/1979 | Richey et al. | |
| 4,223,221 A | 9/1980 | Gambini et al. | |
| 4,424,446 A | 1/1984 | Inbar et al. | |
| 4,882,494 A | 11/1989 | Rogers et al. | |
| 4,899,054 A | 2/1990 | Barfod | |
| 5,079,424 A | 1/1992 | Kobayashi | |
| 5,171,986 A | 12/1992 | Loomis et al. | |
| 5,237,173 A | 8/1993 | Stark et al. | |
| 5,412,215 A | 5/1995 | Shuto et al. | |
| 5,550,377 A | 8/1996 | Petrillo et al. | |
| 5,575,686 A * | 11/1996 | Noschese | 439/620.21 |
| 5,646,408 A | 7/1997 | Goldberg et al. | |
| 5,677,536 A | 10/1997 | Vickers | |
| 6,087,656 A | 7/2000 | Kimmich et al. | |
| 6,129,559 A * | 10/2000 | Hirata et al. | 439/74 |
| 6,134,293 A | 10/2000 | Guendel | |
| 6,342,698 B1 | 1/2002 | Stark | |
| 6,758,682 B1 * | 7/2004 | Kosmala | 439/66 |
| 6,776,668 B1 * | 8/2004 | Scyoc et al. | 439/700 |
| 6,861,862 B1 * | 3/2005 | Tate | 324/756.02 |
| 6,908,347 B2 * | 6/2005 | Sasaki | 439/824 |
| 6,951,466 B2 * | 10/2005 | Sandoval et al. | 439/74 |
| 6,976,850 B2 * | 12/2005 | Tai et al. | 439/66 |
| 2002/0163996 A1 | 11/2002 | Kerrien et al. | |
| 2003/0057375 A1 | 3/2003 | Williams et al. | |

FOREIGN PATENT DOCUMENTS

WO   02099459 A1   12/2002

OTHER PUBLICATIONS

International Search Report dated Jun. 26, 2006.

* cited by examiner

*Primary Examiner* — Gary F. Paumen
(74) *Attorney, Agent, or Firm* — Pearne & Gordon LLP

(57) ABSTRACT

An interconnect subsystem having a sensor, at least one substrate, at least one contact assembly to said sensor and said substrate, and optionally a registration pin connected to said sensor and passing through said substrate. The contact assembly includes a guide tube, a spring within the guide tube, and a transmission tube having a contact surface and at least partially within the guide tube and forced outward by the spring, such that the contact surface contacts conductive pads on the substrate.

28 Claims, 3 Drawing Sheets

SENSOR INTERCONNECT SYSTEM

CROSS-REFERENCESS TO RELATED APPLICATIONS

This application claims the benefit of U.S. provisional patent application No. 60/615,831 filed on Oct. 4, 2004 and incorporated herein by reference.

BACKGROUND OF THE INVENTION

This application relates generally to an assembly and electrical interconnect method for the assembly of diagnostic imaging sensor systems.

More specifically, this application relates to an electrical interconnect device and system for a medical imager having a radiation sensor and one or more substrates.

In the field of Medical Imaging, all modalities employ sensors to gather, interpret and process specific stimulus. These sensors are typically comprised of a plurality of discrete sensors interconnected in such a manner as to provide a composite representation of the stimulus. Of particular importance is the ability to package sensors in such a manner that the maximum signal is derived from the stimulus. Depending on the modality, maximization of the signal may be achieved by packing these sensors tightly together to provide the highest level of geometric efficiency. In one modality, single and dual photon Nuclear Medicine, a large array of discrete sensors is typically employed to image an area up to 0.5 m2.

Example diagnostic imaging systems and methods that could use the disclosed invention are described in one or more of co-pending U.S. patent application Ser. Nos. 11/101,673 filed on Apr. 8, 2005; Ser. No. 11/140,337 filed on May 27, 2005; Ser. No. 11/140,336 filed on May 27, 2005; and Ser. No. 11/171,028 filed on Jun. 30, 2005; and co-pending utility application attorney docket number 37087US1, filed on Sep. 30, 2005; each incorporated herein by reference for all that they teach.

The sensors of traditional systems are typically assembled from photo-multiplier tubes (PMTs) or small semiconductor sensors. Each sensor is typically connected to a current or voltage amplifier then sent to additional processing electronics to provide the composite representation. Additionally, PMTs require an excitation voltage on the order of 1000 volts to provide the acceleration potential for photon multiplication. It is necessary to place and align these sensors in a registered manner, typically independent from the read-out electronics used to process the sensor output.

Traditional methods have employed discrete wires, connectors, and cable assemblies to transmit signals to and from the individual image sensors. Typically, interconnections were made directly from a PMT to an amplifier assembly. A cable assembly comprised of multiple single conductor wires is used to interconnect the PMT to the amplifier. Another method has the PMT connected to amplifier electronics and then the amplifier output is transmitted via a cable assembly to the processing electronics. It also requires a separate connector/cable assembly to interconnect the high potential excitation voltage.

These methods require substantial manual assembly and are prone to error. Secondly, the volume required for the wire assemblies precludes higher density packaging. Maintenance of these systems is problematic in that the service engineer must partially disassemble the detector to work on the system.

An interconnect scheme and assembly method would be useful that provides the ability to construct the sensor array in such a manner as to permit ease of assembly, improved signal clarity, and compact construction, and accurate alignment of sensors interconnects. Further useful would be sensors, mechanical components, and electronic subassemblies all packaged together in a monolithic assembly.

SUMMARY OF THE INVENTION

Provided is a contact assembly for connecting a sensor to a substrate removed from the sensor by some distance, the contact assembly comprising: a guide tube mechanically and electrically connected to the sensor and fixed to the sensor; a spring within the guide tube; and a transmission tube having a contact surface at one end, the transmission tube being at least partially inserted into the guide tube at another end and being longitudinally moveable within the guide tube.

The spring provides an outward force on the transmission tube, and the contact surface is forced into contact against a conductive pad on the substrate by the spring.

Also provided is a sensor interconnect subsystem for an imaging system, the subsystem comprising: a sensor; a substrate having an electrically conductive pad; and a contact assembly for connecting the sensor to the substrate.

The contact assembly comprises a guide tube mechanically and electrically connected to the sensor; a spring within the guide tube; and a transmission tube having a contact surface at one end, the transmission tube being at least partially inserted in the guide tube at another end and being longitudinally moveable within the guide tube.

The spring provides an outward force on the transmission tube; and the contact surface is forced into contact against the conductive pad by the spring.

Still further provided is a sensor interconnect subsystem for an imaging system, the subsystem comprising: a sensor; a first substrate mounted above the sensor and having a hole therethrough and having a first electrically conductive pad; a second substrate mounted above the first substrate and having a second electrically conductive pad; and at least a first and second contact assembly.

Each contact assembly includes: a guide tube mechanically and electrically connected to the sensor; a spring within the guide tube; and a transmission tube having a contact surface at one end and at least partially inserted in the guide tube at another end and moveable within the guide tube.

The spring provides an outward force on the transmission tube and the contact surface of the first contact assembly is forced into contact against the first conductive pad by the first contact assembly spring; and the contact surface of the second contact assembly is forced into contact against the second conductive pad by the second contact assembly spring, and further a portion of the second contact assembly passes through the hole.

Even further provided is a sensor interconnect subsystem for a medical imaging system, the subsystem comprising: a radiation sensor; a first substrate mounted above the sensor and having a first and second hole therethrough and having a first electrically conductive pad; a second substrate mounted above the first substrate and having a third hole therethrough and having a second electrically conductive pad; a registration pin mechanically connected to the sensor and passing through the second hole and the third hole, wherein the registration pin provides lateral alignment of the sensor with the first and second substrates; and at least a first and second contact assembly.

Each contact assembly includes: a guide tube mechanically and electrically connected to the sensor; a spring within the guide tube; and a transmission tube having a contact surface at one end, the transmission tube being at least partially inserted in the guide tube at another end and being longitudinally moveable within the guide tube.

The spring provides an outward force on the transmission tube. The contact surface of the first contact assembly is forced into contact against the first conductive pad by the first contact assembly spring; and the contact surface of the second contact assembly is forced into contact against the second conductive pad by the second contact assembly spring, and further a portion of the second contact assembly passes through the first hole.

And still further provides is an interconnect subsystem for a medical imaging system for detecting the transit of a bolus of an injected radiotracer through a patient, the medical imaging system including a radiation sensor, a first substrate mounted above the sensor and having a first and second hole therethrough and having a first electrically conductive pad, and a second substrate mounted above the first substrate and having a third hole therethrough and having a second electrically conductive pad.

The sensor interconnect subsystem comprises: a registration pin mechanically and fixedly connected to the sensor and passing through the second hole and the third hole, wherein the registration pin provides lateral alignment of the sensor with the first and second substrates; and at least a first and second contact assembly having a contact surface.

The contact surface of the first contact assembly is mechanically forced into contact against the first conductive pad; and the contact surface of the second contact assembly is mechanically forced into contact against the second conductive pad, and further a portion of the second contact assembly passes through the first hole. Other embodiments are also contemplated.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION OF THE PREFERRED EMBODIMENTS

The apparatus and method disclosed herein can improve on existing interconnect methods by employing a mechanically registered direct-connect electrical transmission scheme. The invention contemplates employing electrical interconnects that adapt to varying mechanical tolerances while providing a reliable electrical connection for both low-level, small signal and high-potential, large signal applications. The connection method may be implemented using a variety of interconnection techniques, one example being a spring-driven contact.

The apparatus and method disclosed herein may improve the signal quality of the low-level output of the sensor and result in an improvement in processed signal clarity. Improved signal clarity may be employed to provide improved composite image data as derived from the stimulus.

Figure 1:
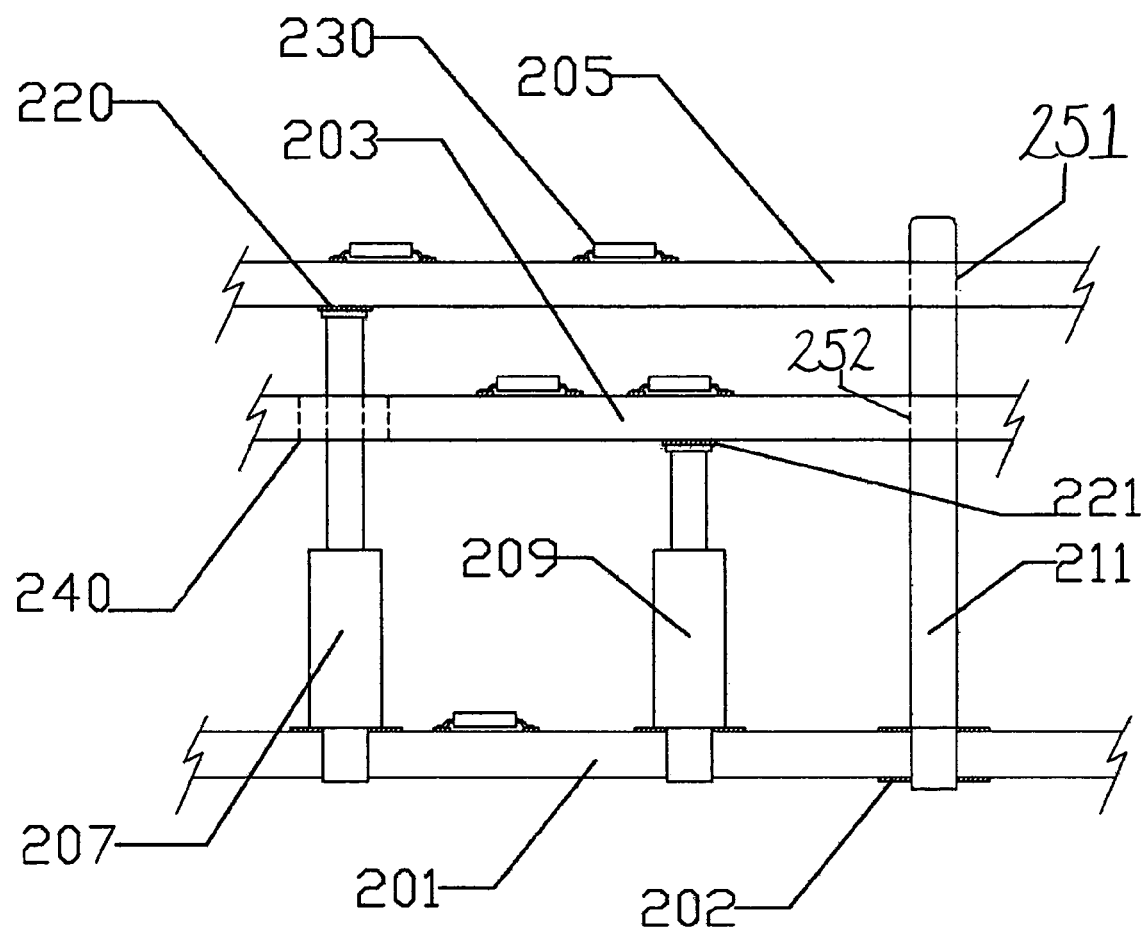
FIG. 1 is a schematic drawing showing features of one embodiment of the interconnect system.

FIG. 1 is a diagram showing one embodiment of the interconnect implementation. The sensor 201 is shown at the bottom of the diagram. The sensor 201 may be comprised of a device appropriate for the imaging modality mounted to an electrical transmission substrate. Mounted to a first substrate 203 is one or more interconnect contact assemblies 209 and, optionally, a means of registration 211. Each contact assembly is comprised of an electrical and mechanical contact 221, 220 that exhibits the ability to adapt and conform to a corresponding mating substrate within a specified mechanical tolerance, and which need not be fixed to the substrate. The mechanical tolerance is dependent on the specific interconnect technology implemented and the geometric design of the sensors themselves. In a representative Gamma camera design mating substrate registration is maintained at +/−0.5 mm.

In the figure, two levels of interconnect are depicted, the lower level substrate 203, may be configured, for example, for different signal characteristics than the upper level, substrate 205. In the figure, a second contact assembly 207 is shown connected to the second, upper substrate 205, and passes through the first, lower substrate 203 via hole 240 in the lower substrate 203. Additional substrates and contact assemblies can also be used in a similar manner. Furthermore, each substrate could use additional interconnects, as necessary, to connect to the same, or additional, sensors. One possible scheme employs a two level structure to transmit high potential signals on one level and low potential signals on the other level. Another scheme would employ two or more mating substrate levels to permit additional circuit densities of similar or disparate (e.g. high potential/low potential) signal paths The optional registration method shown in this diagram consists of a single vertical alignment pin 211 used as the registration. The alignment pin 211 can provide lateral (horizontal) alignment of the sensor to the other components, including the substrate(s). Note that the pin 211 in the shown embodiment is passing through the substrates 203, 205 via holes 251, 252, of typically close tolerance to provide the desired alignment. The pin could also be connected to the substrates, if desired, such as by soldering or gluing, for example.

Figure 2:
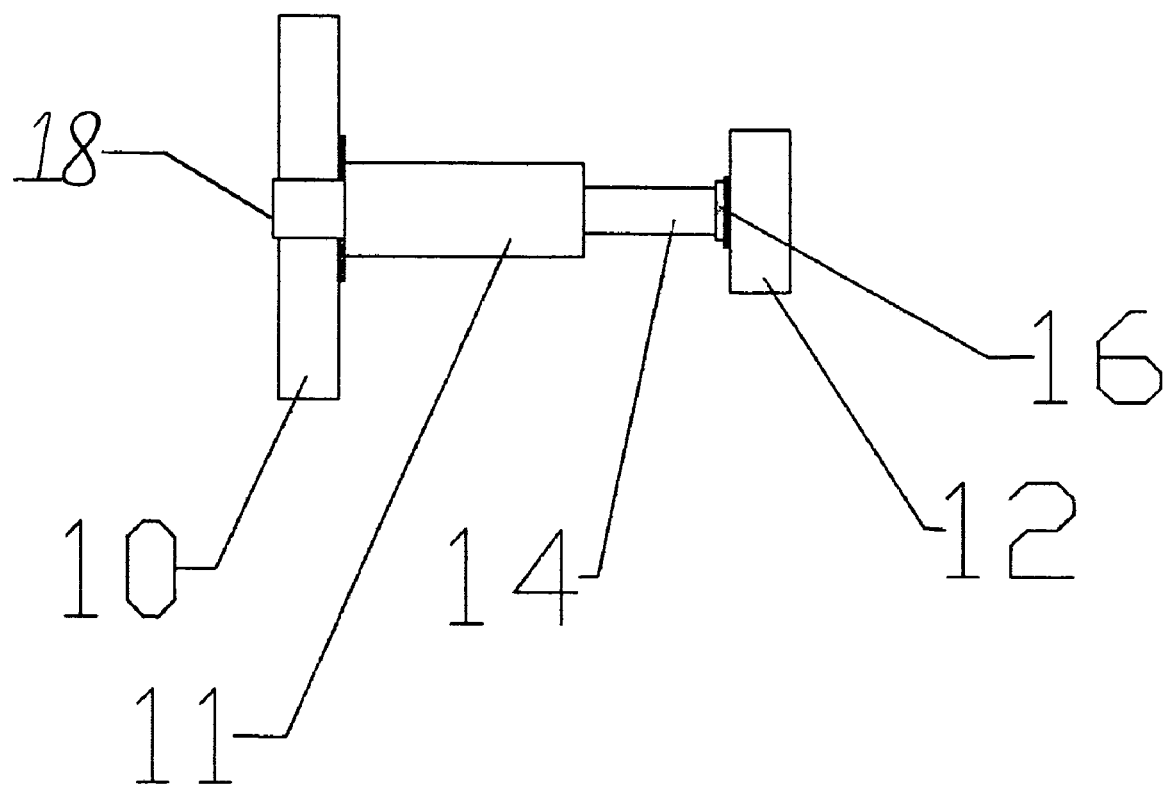
FIG. 2 is a schematic drawing showing detail for a contact assembly as may be used in the interconnect system embodiment of FIG. 1.

Useful for this embodiment, FIG. 2 shows one embodiment of the contact assembly comprised of a fixed guide tube 11, an internal spring within the fixed guide tube (not shown), and an inner movable transmission tube 14 connected to a mating surface 16 that is connected to the substrate 12. The internal spring provides for mechanical tolerance, and a rigid mating component 18 is used to mount the device on the sensor 10. It may be desired to make this mount fixed on the sensor. An alternate method for achieving a functionally similar scheme is the use of a stand-alone spring contact in place of the contact assembly shown.

The fixed guide tube 11 provides stability and guidance to the movable inner tube. The spring, typically comprised of a conductive material, provides pressure on the inner movable tube 14 (which can longitudinally slide past the fixed guide tube 11) to permit conformance to the mating surface 16. Conformance to the mating surface is provided by the longitudinal (vertical with respect to FIG. 1) stroke of the inner tube/spring assembly forced by the spring.

Figure 3:
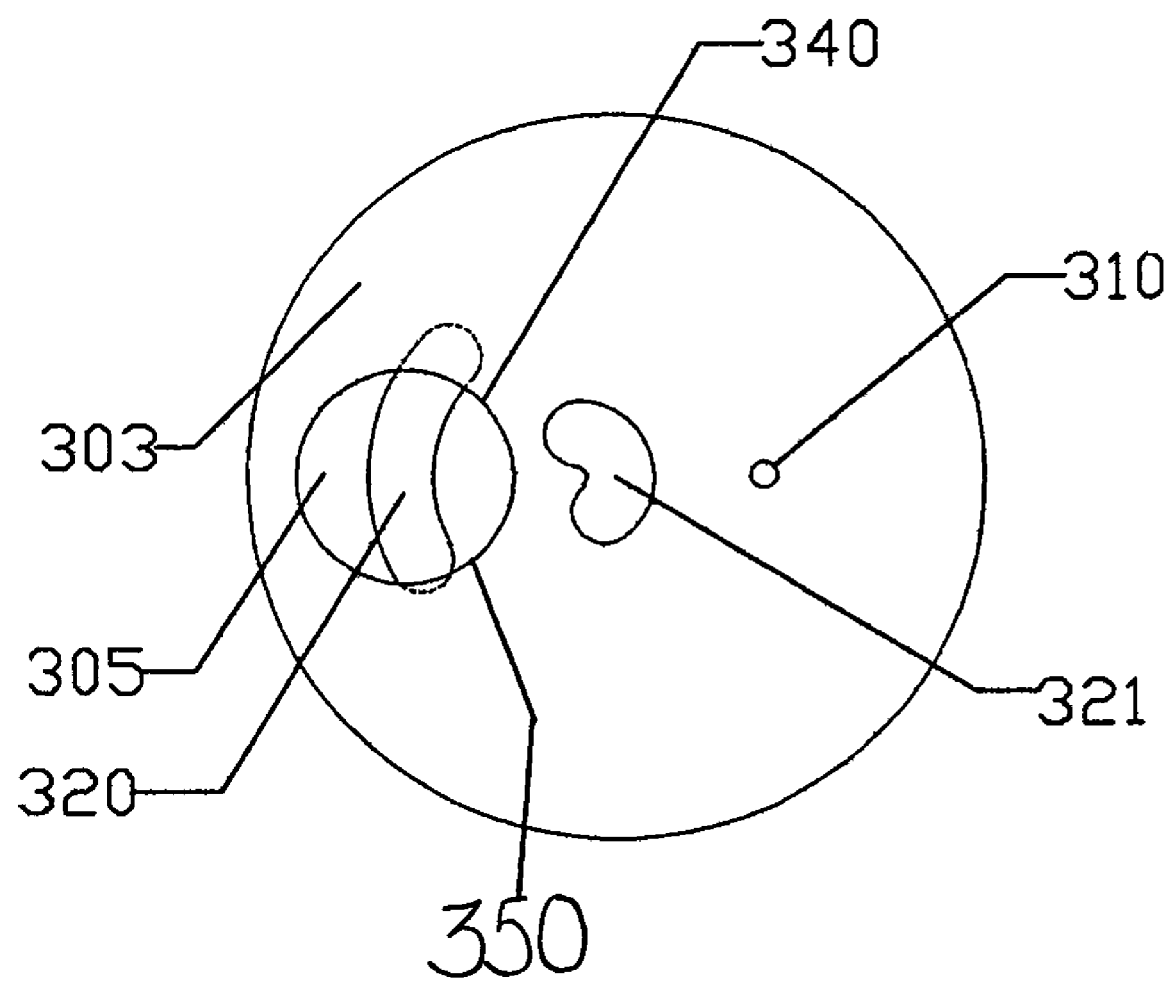
FIG. 3 is a schematic drawing showing additional features of at least some embodiments of the interconnect system.

As shown for a similar embodiment in FIG. 3, mating substrates 303, 305 are equipped with electrically conductive pads 321, 320 that serve as contacts (mating surfaces) for the corresponding contact surface on the contact assemblies. These pads 321, 320 are designed in such a manner as to permit a specified amount of mechanical mis-registration with the contact assemblies, while still providing the intended functions.

A preferred method of fabricating the pads 321, 320 is to enlarge the pad to the lateral limits of the electromechanical design. The specific geometric configuration of the pads is dependent on the design of the receiving system. As can be seen in the figure, this shown embodiment employs pad designs that provides for lateral as well as radial displacement of the sensor with respect to the substrate(s). A variety of methods may be employed to provide registration between the substrates, including one or more alignment holes 310 to accept alignment pins.

FIG. 3 shows this scheme as it might be employed to permit interconnection of disparate signals. It uses multi-level mating surfaces to effect the interconnects while offering mechanically isolated substrates. In this example, the lower (closer to the sensor) substrate 303 is equipped with mating pad 321 and the upper (more distant from the sensor) substrate 305 is equipped with mating pad 320. The lower substrate 303 has a hole 350 to allow the interconnect access to the mating pads on the upper substrate 305.

As discussed above, FIG. 1 depicts the key elements of the sensor system for one embodiment of the invention—the sensor, interconnect device(s), and one or more substrates. The sensor may be comprised of one or more active components, for example. In at least one embodiment, the sensor contains the basic conversion element, a photomultiplier tube or semiconductor, to convert energy from one or more spectra to electrical energy.

Outputs from the sensor may be processed by passive and/or active electrical components prior to transmission to the processing components contained on the substrate (see, e.g., item 230 of FIG. 1). The sensor elements and their contingent passive and/or active electrical components are typically arranged and interconnected on a printed circuit substrate comprised of conductive elements (e.g. copper) on a non-conductive substrate. The non-conductive substrate may be comprised of a flat, rigid material such as FR-4 or a flexible, conformable material such as Pyralux, both materials are available from manufacturers such as Dupont Corporation.

Interconnects from the sensor assembly to the mating substrate(s) are accomplished through a conductive element, which may be part of the disclosed contact assembly. The conductive element is comprised of a conductive substance that can reliably conform to both the sensor substrate and the mating substrate in the presence of allowable alignment tolerances and other environmental considerations such as expansion/contraction and vibration. In one embodiment, the interconnecting conductive element is comprised of the rigid mating component 18 (of FIG. 2) that penetrates and attaches to the sensor substrate to provide appropriate mechanical attachment and electrical connection. For this at least one embodiment, the rigid mating component (base) 18 is typically inserted through the sensor substrate then bonded or bonded directly to the surface of the sensor substrate. In either case the bonding action is accomplished through use of solder or other conductive material.

In at least one embodiment, an intermediate mating component, can be employed to provide an in-plane connection to the mating electrical connection and its substrate. This component is electrically conductive in at least one axis (e.g., vertical Z-axis). The mating component is spring-loaded to provide pressure in the Z-axis so as to mate with the conforming substrate. The intermediate mating component may be configured in a number of different geometries including that of the shown embodiments (round). The round mating element is contained within the rigid element. A conductive spring contained within the rigid and mating elements provides means to convey the electrical signal between the elements and to provide conformance between the sensor and the mating substrate.

A completed assembly is assembled employing the sensor interconnect scheme. The entire assembly is mechanically referenced through an aluminum plate and vertical reference pins.

The invention has been described hereinabove using specific examples and embodiments; however, it will be understood by those skilled in the art that various alternatives may be used and equivalents may be substituted for elements and/or steps described herein, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent, disclosed or not, covered thereby.

What is claimed is:

1. A contact assembly connecting a sensor to a substrate removed from the sensor by some distance, said contact assembly comprising:
    said sensor;
    said substrate;
    a guide tube mechanically and electrically connected to said sensor and fixed to said sensor;
    a spring within said guide tube; and
    a transmission tube having a contact surface at one end, said transmission tube being at least partially inserted into said guide tube at another end and being longitudinally moveable within said guide tube, wherein
    said spring provides an outward force on said transmission tube, and wherein
    said contact surface is forced into contact against a conductive pad on the substrate by said spring.

2. The assembly of claim 1, wherein the imaging system is a medical imaging system and wherein the sensor is a photomultiplier tube for detecting the transit of a bolus of an injected radiotracer through a patient.

3. The assembly of claim 1, wherein said contact surface is not mechanically fixed to the conductive pad.

4. An sensor interconnect subsystem for an imaging system, said subsystem comprising:
    a sensor;
    a substrate having an electrically conductive pad; and
    a contact assembly for connecting said sensor to said substrate, said contact assembly including:
        a guide tube mechanically and electrically connected to the sensor;
        a spring within said guide tube; and
        a transmission tube having a contact surface at one end, said transmission tube being at least partially inserted into said guide tube at another end and being longitudinally moveable within said guide tube, wherein
        said spring provides an outward force on said transmission tube; and wherein
        said contact surface is forced into contact against the conductive pad by said spring.

5. The subsystem of claim 4, wherein said contact assembly is for conforming to the substrate within a specified mechanical tolerance.

6. The subsystem of claim 4, wherein said conductive pads permit a specified amount of mechanical mis-registration while providing an electrical connection and a specified mechanical tolerance.

7. The subsystem of claim 6, wherein said registration is maintained at +/−0.5 mm.

8. The subsystem of claim 4, further comprising a registration pin mechanically connected to said sensor and connected to or passing through said substrate, wherein said registration pin provides lateral alignment of the sensor with the substrate.

9. The subsystem of claim 4, wherein the imaging system is a medical imaging system and wherein the sensor is a photomultiplier tube for detecting the transit of a bolus of an injected radiotracer through a patient.

10. The subsystem of claim 4, wherein said contact surface is not mechanically fixed to said conductive pad.

11. A sensor interconnect subsystem for an imaging system, said subsystem comprising:
    a sensor;
    a first substrate mounted above said sensor and having a hole therethrough and having a first electrically conductive pad;
    a second substrate mounted above said first substrate and having a second electrically conductive pad; and
    at least a first and second contact assembly, each contact assembly including:
        a guide tube mechanically and electrically connected to the sensor;
        a spring within said guide tube; and
        a transmission tube having a contact surface at one end and at least partially inserted into said guide tube at another end and moveable within said guide tube, wherein
        said spring provides an outward force on said transmission tube;
    wherein said contact surface of said first contact assembly is forced into contact against the first conductive pad by the first contact assembly spring; and
    wherein said contact surface of said second contact assembly is forced into contact against the second conductive pad by the second contact assembly spring, and further
    wherein a portion of said second contact assembly passes through said hole.

12. The subsystem of claim 11, wherein each contact assembly is for conforming to its corresponding substrate within a specified mechanical tolerance.

13. The subsystem of claim 11, wherein said conductive pads permit a specified amount of mechanical mis-registration while providing an electrical connection and a specified mechanical tolerance.

14. The subsystem of claim 13, wherein said registration is maintained within +/−0.5 mm.

15. The subsystem of claim 11, further comprising a registration pin mechanically connected to said sensor and passing through said first substrate and is connected to or passes through said second substrate, wherein said registration pin provides lateral alignment of the sensor with the first and second substrates.

16. The subsystem of claim 11, wherein the imaging system is a medical imaging system and wherein the sensor is a photomultiplier tube for detecting the transit of a bolus of an injected radiotracer through a patient.

17. The subsystem of claim 11, wherein one or both of said contact surfaces are not mechanically fixed to the corresponding conductive pad.

18. A sensor interconnect subsystem for a medical imaging system, said subsystem comprising:
    a radiation sensor;
    a first substrate mounted above said sensor and having a first and second hole therethrough and having a first electrically conductive pad;
    a second substrate mounted above said first substrate and having a third hole therethrough and having a second electrically conductive pad;
    a registration pin mechanically connected to said sensor and passing through said second hole and said third hole, wherein said registration pin provides lateral alignment of said sensor with said first and second substrates; and
    at least a first and second contact assembly, each contact assembly including:
        a guide tube mechanically and electrically connected to said sensor;
        a spring within said guide tube; and
        a transmission tube having a contact surface at one end, said transmission tube being at least partially inserted into said guide tube at another end and being longitudinally moveable within said guide tube, wherein
        said spring provides an outward force on said transmission tube;
    wherein said contact surface of said first contact assembly is forced into contact against said first conductive pad by said first contact assembly spring; and
    wherein said contact surface of said second contact assembly is forced into contact against said second conductive pad by said second contact assembly spring, and further
    wherein a portion of said second contact assembly passes through said first hole.

19. The subsystem of claim 18, wherein each contact assembly is for conforming to its corresponding substrate within a specified mechanical tolerance.

20. The subsystem of claim 18, wherein said conductive pads permit a specified amount of mechanical mis-registration while providing an electrical connection and a specified mechanical tolerance.

21. The subsystem of claim 20, wherein said registration is maintained within +/−0.5 mm.

22. The subsystem of claim 18, wherein said radiation sensor is a photomultiplier tube for detecting the transit of a bolus of an injected radiotracer through a patient.

23. The subsystem of claim 18, wherein one or both of said contact surfaces are not mechanically fixed to the corresponding conductive pad.

24. An interconnect subsystem for a medical imaging system for detecting the transit of a bolus of an injected radiotracer through a patient, the medical imaging system including a radiation sensor, a first substrate mounted above the sensor and having a first and second hole therethrough and having a first electrically conductive pad, and a second substrate mounted above the first substrate and having a third hole therethrough and having a second electrically conductive pad, said interconnect subsystem comprising:
    a registration pin mechanically and fixedly connected to said sensor and passing through the second hole and the third hole, wherein said registration pin provides lateral alignment of the sensor with the first and second substrates; and
    at least a first and a second contact assembly having a contact surface;

wherein said contact surface of said first contact assembly is mechanically forced into contact against the first conductive pad; and wherein said contact surface of said second contact assembly is mechanically forced into contact against the second conductive pad, and further wherein a portion of said second contact assembly passes through said first hole.

25. The subsystem of claim 24, wherein each contact assembly includes:
   a guide tube mechanically and electrically connected to the sensor;
   a spring within said guide tube; and
   a transmission tube having the contact surface at one end, said transmission tube being at least partially inserted into said guide tube at another end and being moveable within said guide tube, wherein
   said spring provides an outward force on said transmission tube for providing said mechanically forced contact.

26. The subsystem of claim 25, wherein one or both of said contact surfaces are not mechanically fixed to the corresponding conductive pad.

27. The subsystem of claim 24, wherein one or both of said contact surfaces are not mechanically fixed to the corresponding conductive pad.

28. A device comprising:
   a contact assembly;
   a sensor; and
   a substrate removed from the sensor by some distance,
   said contact assembly connecting said substrate to said sensor and comprising:
   a guide tube mechanically and electrically connected to the sensor and mechanically fixed to said sensor;
   a spring within said guide tube; and
   a transmission tube having a contact surface at one end, said transmission tube being at least partially inserted into said guide tube at another end and being longitudinally moveable within said guide tube, wherein
   said spring provides an outward force on said transmission tube, and wherein
   said contact surface is forced into contact against a conductive pad on the substrate by said spring for providing an electrical connection between said sensor and said substrate during operational use of said device.

* * * * *